(12) United States Patent
Wang

(10) Patent No.: US 7,014,703 B2
(45) Date of Patent: Mar. 21, 2006

(54) METHOD FOR ANNEALING GROUP IIA METAL FLUORIDE CRYSTALS

(75) Inventor: Liming Wang, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/903,699

(22) Filed: Jul. 30, 2004

(65) Prior Publication Data

US 2005/0139147 A1    Jun. 30, 2005

Related U.S. Application Data

(60) Provisional application No. 60/533,766, filed on Dec. 30, 2003.

(51) Int. Cl.
*C30B 25/12*    (2006.01)

(52) U.S. Cl. .............................. 117/3; 117/2; 117/937
(58) Field of Classification Search ................ 117/2, 117/3, 937

See application file for complete search history.

(56) References Cited

U.S. PATENT DOCUMENTS

| | | | |
|---|---|---|---|
| 6,309,461 B1 | 10/2001 | Gianoulakis et al. | 117/206 |
| 6,332,922 B1 | 12/2001 | Sakuma et al. | 117/3 |
| 6,333,922 B1 | 12/2001 | Campanella | 370/319 |
| 6,375,551 B1 | 4/2002 | Darcangelo et al. | 451/41 |
| 6,395,657 B1 | 5/2002 | Mayolet et al. | 501/3 |
| 6,630,117 B1 | 10/2003 | Sparrow | 423/490 |
| 2002/0185057 A1 | 12/2002 | Garibin et al. | 117/94 |

OTHER PUBLICATIONS

CRC Handbook of Chemistry and Physics, 80th edition, CRC Press p. 4-48.

*Primary Examiner*—Felisa Hiteshew
(74) *Attorney, Agent, or Firm*—Walter M. Douglas

(57) ABSTRACT

The invention is directed to a method for processing and annealing metal fluoride single crystals. Among other steps, the method includes of removing the as-grown surfaces of the crystals after they emerge from the growth furnace, processing the surfaces in such way that all the crystal surfaces have the same thermal properties, and then placing the crystals in a secondary annealing furnace to further anneal the crystals to release the residual stresses resulting from the primary annealing process. The invention is suitable for metal fluoride crystals of general formula $MF_2$, where M is calcium, magnesium, barium and strontium, and mixtures thereof.

6 Claims, 4 Drawing Sheets

US 7,014,703 B2

METHOD FOR ANNEALING GROUP IIA METAL FLUORIDE CRYSTALS

CLAIM OF PRIORITY

This application claims the priority benefit of U.S. Provisional Application No. 60/533,766 filed Dec. 30, 2003.

FIELD OF THE INVENTION

This invention is directed to a method for preparing metal fluoride single crystals, and in particular to a method for annealing metal fluoride single crystals.

BACKGROUND OF THE INVENTION

The burden of the demands for the improved performance of computers and other electronic devices falls on the lithographic processes used to fabricate integrated circuit chips. Lithography involves irradiating a mask and focusing the pattern of this mask through an optical microlithography system onto a wafer coated with a photoresist. The pattern on the mask is thereby transferred onto the wafer. Decreasing the line-widths of the features on a given wafer brings about advances in performance. The enhanced resolution required to achieve finer line-widths is accomplished by decreasing the wavelength of the illumination source. As a result, the energies used in lithographic patterning are moving deeper into the UV region. Consequently, optical components capable of reliable performance at these short optical microlithography wavelengths are required.

Few materials are known that have a high transmittance at wavelengths below 200 nm, for example, at 193 nm and 157 nm, and also do not deteriorate under intense laser exposure. Fluoride crystals such as those of magnesium fluoride, calcium fluoride and barium fluoride are potential materials that have a high transmittance at wavelengths <200 nm. Projection optical photolithography systems and <200 nm excimer laser systems that utilize vacuum ultraviolet wavelengths of light at and below 200 nm provide desirable benefits in terms of achieving smaller feature dimensions. Consequently, excimer lasers and microlithography systems that utilize vacuum ultraviolet wavelengths in the 157 nm wavelength region have the potential of improving integrated circuits and their manufacture.

The commercial use and adoption of 193 nm and below vacuum ultraviolet wavelengths ("VUV"), for example the 157 nm wavelength region, has been hindered by the transmission nature of such deep ultraviolet wavelengths through optical materials. The slow progression in the use of VUV light below 200 nm (e.g., 157 nm region light) by the semiconductor industry has been also due to the lack of economically manufacturable, high quality blanks of optically transmissive materials suitable making below 200 nm microlithography optical elements. Consequently in order to utilize deep ultraviolet photolithography to manufacture integrated circuits using, for example, fluorine excimer lasers, there is a need for below 200 nm wavelength transmitting optical fluoride crystals such as those made from the fluorides of magnesium, calcium and barium. Such crystals must be of high quality, possess few defects and have beneficial, highly qualified optical including low contaminant levels, and be of low birefringence.

The process of growing large metal fluoride single crystals that are relatively free of defects typically lasts several weeks; particularly for high optical quality fluoride single crystals and below 200 nm optical lithography single crystal blanks. The cost of the equipment to produce high quality crystals, as well as the staging of the crystal-growth process, is high and there is no guarantee of having a successful result at the end of the growth process. Therefore, there has long been a concerted effort to increase the yield of high quality metal fluoride single crystals.

Optical crystals can be grown by any of several methods known in the art; for example the Stockbarger, Bridgman-Stockbarger and Czochralski methods, and the methods described in U.S. Pat. Nos. 6,630,117, 6,395,657, and 6,333,922 B1. In the Bridgman-Stockbarger method, the optical crystals are grown in a vertical furnace by moving molten crystal material through a temperature gradient zone in the furnace. There are typically two temperature zones in the furnace; an upper or growth zone and a lower or annealing/cooling zone.

Crystals grown using Bridgman-Stockbarger method are exposed to sharp localized cooling as they are translated through a temperature gradient zone from the upper zone into the lower zone. The sharp localized cooling that occurs during this translation induces permanent thermal strain (stress) in the crystals that consequently gives rise to unacceptably elevated birefringence values in the crystals. In order to reduce the permanent thermal strain in the crystal, the crystal is annealed in the lower zone of the growth furnace. This annealing in the lower zone is generally known as "primary" annealing and is conducted for a selected time over a selected temperature range from less than that of the melting point of the metal fluoride down to ambient temperature. (A number of different time/temperature profiles for primary annealing are known in the art.) After the annealing is complete and the crystal has been cooled to near ambient temperature, it is removed from the growth furnace and the birefringence of the crystal is measured. If the crystal has an unacceptably high birefringence value, the crystal is further annealed in a separate furnace from the growth furnace. This second annealing process is generally referred to as "post-annealing" or "secondary annealing". (A number of secondary annealing profiles are also known in the art, one example being U.S. Pat. No. 6,332,922.) Metal fluoride crystals grown using the Bridgman-Stockbarger or other process are usually grown as cylindrical disks or ingots that are subsequently processed and shaped into optical elements.

The crystal surfaces (the as-grown surfaces of the crystal) are formed during the crystal growth and primary annealing process. These as-grown surfaces consist of a layer of graphite particles, gas bubbles, smaller metal fluoride crystals and other optically opaque compounds on their surface. This layer of material (metal fluoride, graphite, bubbles, and distinct small metal fluoride crystals) has significantly different thermal properties such as emissivity, absorption coefficient, specific heat, thermal conductivity and density as compared to a pure metal single crystal surface that doers not contain such substances. Based on actual observations, the compositions and structure of the as-grown surfaces are not consistent as between the top surface, the bottom surface and the side surface of a cylindrical metal fluoride disc. They may also vary from disk-to-disk and from run-to-run. These variations of the as-grown crystal surfaces are one of the major causes of crystal quality variations. Consequently, there is need to have a better method of growing metal fluoride single crystals; and particularly for a method that will reduce birefringence and crystal-to-crystal variations in quality.

SUMMARY OF THE INVENTION

The invention is directed to a method for processing and annealing metal fluoride single crystals and optical elements made therefrom. Among other steps, the method includes of removing the as-grown surfaces of the crystals after they emerge from the primary annealing, processing the surfaces in such way that all the crystal surfaces have the same thermal properties, and then placing the crystals in a secondary annealing furnace to further anneal the crystals to release the residual stresses resulting from the primary annealing process. The invention is suitable for metal fluoride crystals of general formula $MF_2$, where M is calcium, magnesium, barium and strontium, and mixtures thereof.

In one aspect the invention includes removing and processing the as-grown surfaces of an as-grown metal fluoride disk to remove unwanted material or contaminants (e.g., graphite particles, small metal fluoride crystals, etc.) and polishing the surfaces of the disk to have uniform properties.

In another aspect the invention includes loading the processed crystals having uniform surface properties into a secondary annealing furnace and annealing the crystals in the furnace to release stresses and improve birefringence and homogeneity quality.

In yet another aspect the invention uses thermal modeling and analysis to illustrate that the as-grown surfaces of a crystal tend to result from higher thermal gradients in the near-surface regions of the crystal during the crystal growth and annealing process. These higher gradients are believed due to, at least in part, the presence of graphite particles from a typical growth crucible, bubbles and small crystals as explained above. The higher thermal gradients during the crystal annealing process will result in high thermal stresses which in turn induce higher birefringence and greater inhomogeneity. Therefore, the formation of the as-grown surfaces is a limiting factor for final crystal quality. These higher thermal gradients may be the factor that precludes the primary annealing process from producing metal fluoride CaF2 crystals that meet the 157 nm birefringence and homogeneity specifications.

In a further aspect the invention is directed to a method of preparing a metal fluoride single crystal having reduced stress birefringence, said method comprising the steps of growing a metal fluoride single crystal according to any crystal growth method known in the art; cleaning and polishing the grown crystal to remove surface imperfections, and subjecting the cleaned and polished crystal to a secondary annealing process to thereby form a metal fluoride single crystal having reduced stress birefringence and improved homogeneity.

BRIEF DESCRIPTION OF THE DRAWINGS

The patent or application file contains at least one drawing executed in color. Copies of this patent or patent application publication with color drawings will be provided by the office upon request and payment of the necessary fee.

DETAILED DESCRIPTION OF THE INVENTION

Figure 1:
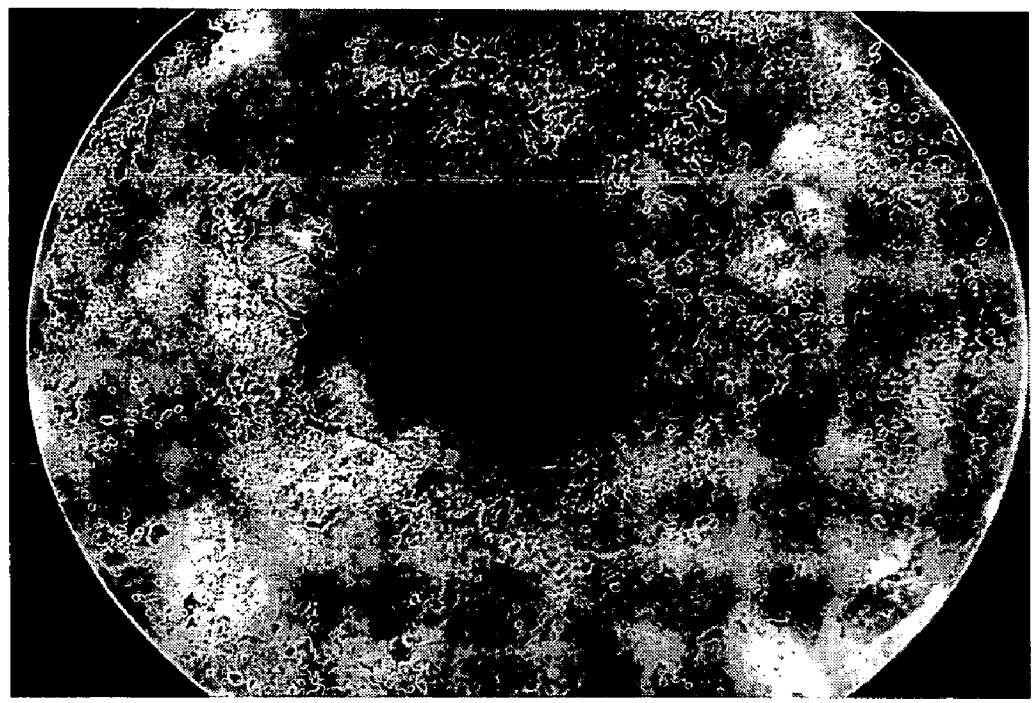
FIG. 1 illustrates a typical $CaF_2$ disk and its as-grown surface condition.

The invention will now be described in detail with reference to a few preferred embodiments as illustrated in the accompanying drawings. In the following description numerous details are set forth in order to provide a thorough understanding of the invention. However, it will be apparent to one skilled in the art who reads this specification that the invention may be practiced without some of these specific details. In addition, well-known features and/or process steps have not been described in detail in order to not unnecessarily obscure the invention.

As used herein, the term "metal fluoride" means the Group IIA metal fluoride compounds of general formula $MF_2$, where M is calcium, magnesium, barium and strontium, and mixtures thereof. It also includes any of the foregoing that are doped with selected lanthanide series metal fluoride compounds of general formula $LnF_3$, where Ln is a lanthanide series metal. Calcium fluoride is used as the model metal fluoride material to describe the invention in the paragraphs that follow, and the following description and the figures included herewith should not understood as limiting the invention to this material.

As used herein the term "imperfections" means graphite particles, small crystals and small surface cracks, and other materials or defects that may be present on the surface of a crystal as-grown in a crystal growth furnace. An example, without limitation, of such imperfections may be found in FIG. 1.

Calcium fluoride disks were grown according to the Bridgman-Stockbarger method as known in the art and/or by the methods described in U.S. Pat. Nos. 6,630,117, 6,395,657 and 6,333,922. Briefly, calcium fluoride powder admixed with 1 wt % $PbF_2$ was placed in a carbon crucible and the crucible was placed in a crystal growth furnace having an upper zone for melting the calcium fluoride raw material, a lower zone for annealing a grown crystal, and a baffle or diaphragm between the two zones. The crucible was placed on a movable platform within the furnace and lifted so that it was located within the upper zone. The furnace was slowly evacuated to a pressure of less than 0.1 mm Hg and then heated over a period of approximate 5 hours to a temperature of approximately 500° C. The temperature was held at 500° C. for three hours to dry the metal fluoride powder and the interior elements of the furnace. After the holding time, the temperature of the furnace was raised to above the melting point of calcium fluoride (1418° C., *CRC Handbook of Chemistry and Physics* 80$^{th}$ Ed., CRC Press, 4–48) over a period of about 12 hours. Once the calcium fluoride raw materials had melted and the $PbF_2$ scavenger had reacted with any oxygen containing moieties that are present, the crucible was slowly lowered from the upper melting zone, past the baffle and into the lower annealing zone of the growth furnace. As the crucible progress into the lower zone, the temperature of the zones was gradually lowered at a selected rate as may be found in the art. Once the entire crucible was within the lower zone, the temperature was slowly lowered to ambient or near ambient temperature and the crucible containing a calcium fluoride crystal disk was removed form the furnace. During the above process a dry under gas such as argon or nitrogen can be admitted into the furnace.

Figure 2:
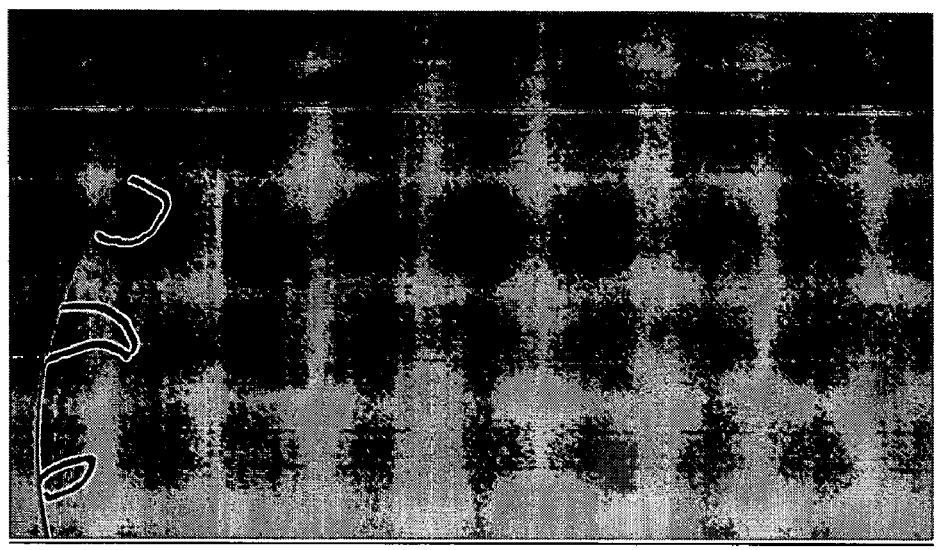
FIG. 2 illustrates a typical $CaF_2$ and its surface conditions, prior to secondary annealing, after the disk has been process in accordance with the invention.

The as-grown crystal disk was examined by optical microscopy and found to be as illustrated in FIG. 1. The as-grown crystal of FIG. 1 shows imperfections such as graphite particles (the black specks), ridges, valleys, small crystals and other on a crystal surface. In accordance with the invention, the surfaces (top, bottom and side of the disk) of an as-grown crystal were cleaned and polished to remove the imperfections, for example by grinding and/or polishing the surfaces using diamond powder or cerium oxide agent, for example, as taught by U.S. Pat. No. 6,375,551; by cutting the contaminated surfaces to remove them (for example, by using a diamond saw) followed by polishing as previously mentioned; or by other methods of removing such imperfections are known or may become known to those skilled in the art. After cleaning and polishing, the disk appears as illustrated in FIG. 2 (marks on left edge are from a felt tip marker). Once the crystal has been cleaned and polished, it was then subjected to a secondary annealing process. After secondary annealing the crystal surfaces, or the surfaces of elements made from the crystal, can be further polished.

Figure 3:
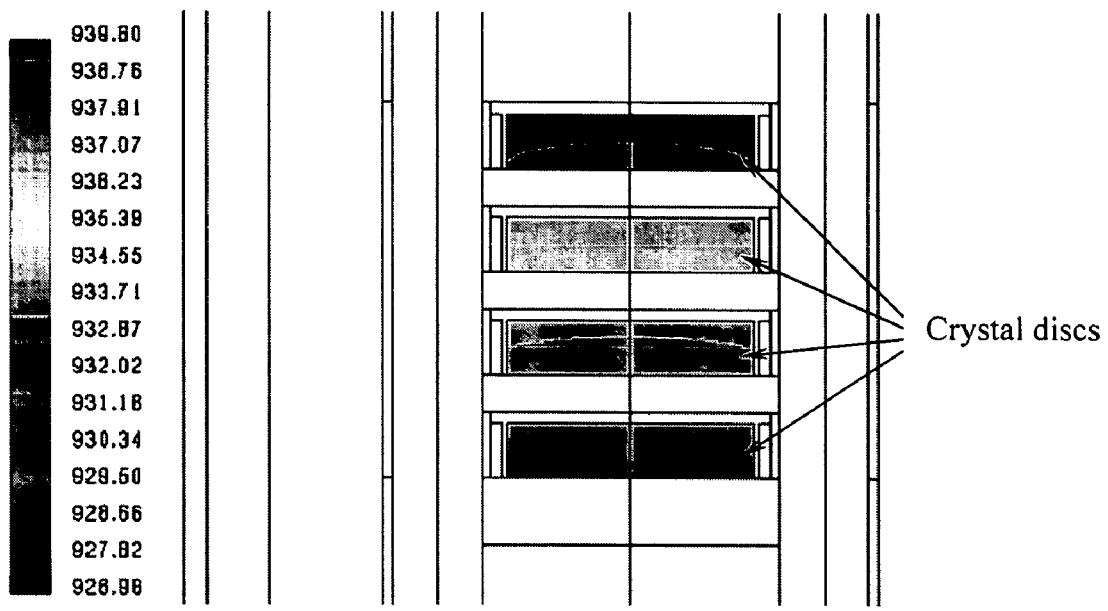
FIG. 3 illustrates the model-predicted crystal temperatures giving rise to opaque surface conditions.
Figure 4:
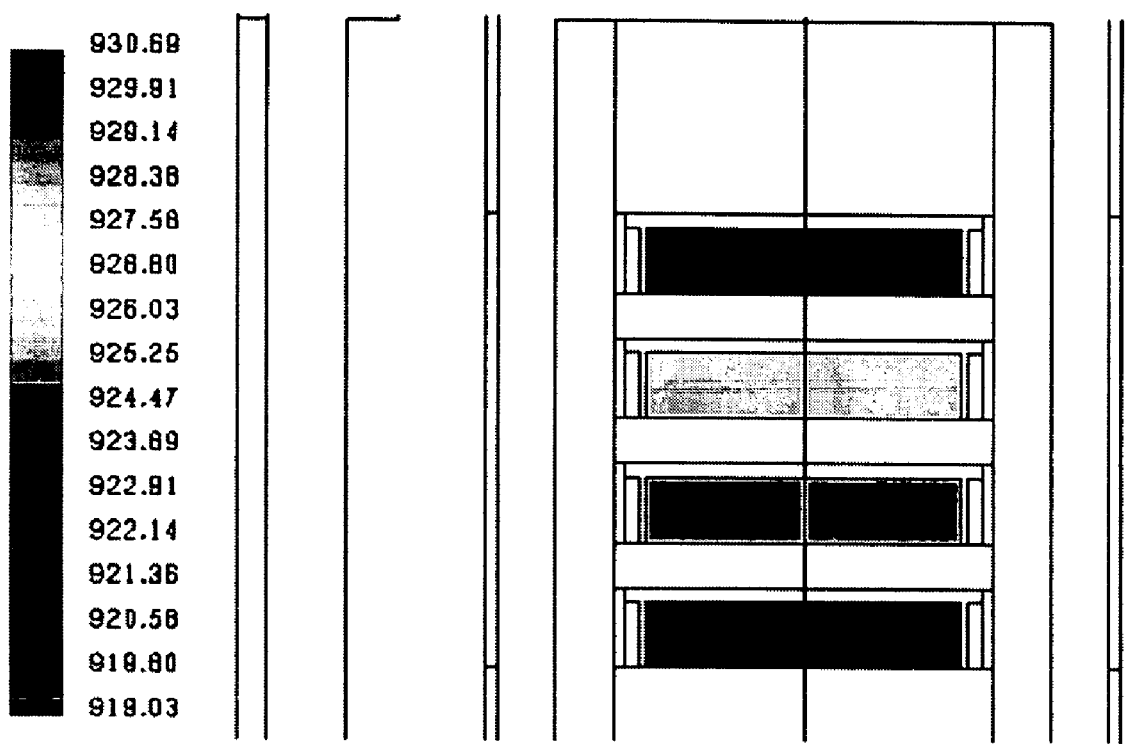
FIG. 4 illustrates the model-predicted crystal temperatures giving rise to transparent surface conditions.

The crystal was modeled using the fluid dynamics modeling software program FLUENT® available from Fluent, Inc, Lebanon, N.H. The model predicts the crystal temperature, shown as shaded "zones" across the crystal in both the vertical and horizontal direction in the accompanying FIGS. 3 and 4, with each zone having a different temperature. Referring to FIGS. 3 and 4, the former illustrates the modeling results for an as-grown, non-cleaned and non-polished crystal as represented by FIG. 1, and the latter illustrates the modeled results for a cleaned and polished crystal as represented by FIG. 2. In each of FIGS. 3 and 4 the bar to the left indicates temperature. On the right in each are four sub-figures that are herein termed (from top to bottom of FIGS. 3 and 4) the upper, upper middle, lower middle and lower figures, respectively, and these, figures represent a metal fluoride material, for example, calcium fluoride, at a temperature as indicated.

FIG. 3 illustrates the modeling results for an as-grown, non-cleaned and non-polished crystal as illustrated in FIG. 1. In FIG. 3 the sub-figures are non-uniform. That is, two or more zones are present in each sub-figure, and each zone has a thickness and extends horizontally across the entire disk. The upper figure illustrates the presence of two zones within the crystal as it is being cooled during the annealing process. In upper middle figure the differences between the two zones appear less, but they are still there. In the lower middle sub-figure one can see that three zone fronts have formed as the temperature continues to be lowered. In the lower sub-figure five different fronts are visible It is the great lack of uniformity in the crystal as shown in the FIG. 3 lower sub-figure (that is, multiple fronts) that leads to stress birefringence in the final crystal after secondary annealing is completed.

FIG. 4 illustrates the modeling results for cleaned and polished crystals as illustrated in FIG. 2. In FIG. 4 the upper, upper middle and lower middle and lower sub-figures all exhibit a single "zone" indicating that the material is uniform throughout. Consequently, the model predicts that the level of stress birefringence, and inhomogeneity, will be much less for the crystal of FIG. 4 than that of the crystal modeled in FIG. 3. As a result of its lower stress birefringence and inhomogeneity, the crystal of FIG. 4, and any optical element from this crystal, will exhibit a higher degree (percentage) of below 200 nm light transmittance.

By cleaning and polishing the as-grown crystal surfaces prior to secondary annealing, all the surfaces of the crystal will have the same thermal properties. That is, the cleaning and polishing removes imperfections, for example, the carbon particles, ridges, valleys and cracks illustrated in FIG. 1, prior to secondary annealing. These imperfections have different thermal properties that influence the temperature profile across and through the crystal during the secondary annealing process. Their removal provides a more uniform temperature profile across and through the crystal during the secondary annealing process.

Once a crystal has been cleaned and polished as taught herein, the crystal is subject to a secondary annealing in a furnace. In the secondary annealing process a crystal is placed in a holder, preferably, or on a surface and raised to a temperature below the melting point of the crystal, typically a temperature in the range of 50–150° C. below the crystal's melting. For calcium fluoride this temperature would be in the range of 1368–1268° C.; for magnesium fluoride (MgF$_2$) a temperature in the range of 1216–1116° C. (a temperature 50–150° C. below MgF$_2$'s melting point of approximately 1266° C.), and similarly for BaF$_2$, SrF$_2$, and mixed-metal fluorides of formula $M^1_xM^2_{1-x}$, where $M^1$ and $M^2$ are different and each is selected from the group consisting of Ca, Ba, Mg and Sr. Once the crystal has been heated to within the selected temperature range the crystal is cooled in a programmed manner. For example, the crystal can be cooled at a constant rate in the range of 1–10° C./hour to ambient (room) temperature. Preferably, the cooling rate is in the range of 1–5° C./hour. Alternatively, the crystal can be cooled to ambient temperature under programmed series of temperature ranges; for example, from a temperature in the range of 50–150° C. below the melting point of the metal fluoride material to a temperature in the range of 250–500° C. below the melting point of the metal fluoride material at a rate in the range of 1–10° C./hour, preferably 1–5° C./hour, followed by cooling to a temperature in the range of 500–750° C. below the melting point at a rate in the range of 5–20° C./hour, followed by cooling to a temperature in the range of 750–1000° C. at a rate in the range of 10–40° C./hour, preferably 10–25° C./hour, and finally by cooling to ambient temperature at a rate of 20–50° C./hour. Other temperature cooling regimes known in the art can also be followed. Some examples of these regimes can be found in U.S. Pat. Nos. 6,332,922 and 6,309,461 (referring to column 5, lines 40–58, and using the method after the metal fluoride crystal is raised to a temperature in the range of 50–150° C. below its melting point); and U.S. application Publication No. 2002/0185057 A1 (referring to the annealing rates contained in paragraph [0021], which procedure occurs after the crystal has been heated to a temperature in the range of 50–150° C. below its melting point). After secondary annealing the crystal, or a part thereof cut from a large crystal, is shaped and polished to produce an optical element for use in below 200 nm lithography.

The foregoing examples of specific compositions, processes, articles and/or apparatus employed in the practice of the present invention are, of course, intended to be illustrative rather than limiting, and it will be apparent that numerous variations and modifications of these specific embodiments may be practiced within the scope of the appended claims.

The invention claimed is:

1. A method of preparing a metal fluoride single crystals having reduced stress birefringence, said method comprising the steps of:
  growing a metal fluoride single crystal according to any crystal growth method known in the art,
  cleaning and polishing the grown crystal to remove surface imperfections, and
  subjecting the cleaned and polished crystal to a secondary annealing process to thereby form a metal fluoride single crystal having reduced stress birefringence where the secondary annealing process comprises:
placing the crystal in a holder in a furnace;
raising the crystal to a temperature in the range of 50–150° C. below the crystal's melting temperature;
cooling the crystal from a temperature in the range of 50–150° C. below its melting point of to a temperature in the range of 250–500° C. below its melting point at a rate in the range of 1–10° C./hour, followed by
cooling the crystal to a temperature in the range of 500–750° C. below its melting point at a rate in the range of 5–20° C./hour, followed by
cooling the crystal to a temperature in the range of 750–1000° C. below its melting point at a rate in the range of 10–40° C./hour, and
cooling the crystal to ambient temperature at a rate of 20–50° C./hour.

2. The method according to claim 1, wherein growing the metal fluoride single crystal comprises growing a metal fluoride of general formula $MF_2$, where M is selected from the group consisting of calcium, barium magnesium and strontium, or mixtures thereof.

3. The method according to claim 1, wherein the secondary annealing process comprises:
placing the crystal in a holder in a furnace;
raising the crystal to a temperature in the range of 50–150° C. below the crystal's melting temperature; and
cooling the crystal at a constant rate in the range of 1–10° C./hour to ambient (room) temperature.

4. The method according to claim 3, wherein the crystal is cooled at a constant rate in the range of 1–5° C./hour to ambient (room) temperature.

5. The method according to claim 3, wherein after annealing the crystal is repolished.

6. The method according to claim 4, wherein after annealing the crystal is repolished.

* * * * *